United States Patent [19]
Loibl

[11] Patent Number: 6,104,618
[45] Date of Patent: Aug. 15, 2000

[54] STRUCTURE FOR CONNECTING A PLURALITY OF MUTUALLY REMOTE ELECTRICAL COMPONENTS TO A CENTRAL UNIT

[75] Inventor: Josef Loibl, Regen, Germany

[73] Assignee: Siemens Aktiengesellschaft, Munich, Germany

[21] Appl. No.: 09/079,094

[22] Filed: May 14, 1998

[30] Foreign Application Priority Data

May 14, 1997 [DE] Germany ............................ 197 20 167

[51] Int. Cl.$^7$ ........................................................ H05K 1/00
[52] U.S. Cl. ............................................................ 361/749
[58] Field of Search ........................... 439/67; 361/749; 174/254

[56] References Cited

U.S. PATENT DOCUMENTS

| | | | |
|---|---|---|---|
| 3,670,639 | 6/1972 | Harden | 361/749 |
| 4,265,549 | 5/1981 | Cote | 361/749 |
| 4,587,719 | 5/1986 | Barth | 361/749 |
| 5,130,499 | 7/1992 | Dijkshoorn | 174/254 |
| 5,250,758 | 10/1993 | Fjelstad et al. | 361/749 |
| 5,398,163 | 3/1995 | Sano | 361/749 |
| 5,639,994 | 6/1997 | Tanaka | 174/254 |
| 5,831,835 | 11/1998 | Dirmeyer et al. | 361/818 |

FOREIGN PATENT DOCUMENTS

| | | |
|---|---|---|
| 3813566A1 | 11/1989 | Germany . |
| 4430798A1 | 3/1996 | Germany . |
| 29508661U1 | 11/1996 | Germany . |
| 1-204495 | 8/1989 | Japan ..................................... 361/749 |
| 96/07301 | 3/1996 | WIPO . |

*Primary Examiner*—Neil Abrams
*Attorney, Agent, or Firm*—Herbert L. Lerner; Laurence A. Greenberg; Werner H. Stemer

[57] ABSTRACT

A structure connects a plurality of mutually remote electrical components to a central unit. The components have terminal contacts that are connected through conductor tracks to connection contacts of the central unit. The conductor tracks are constructed on the flexible printed circuit board in such a way as to provide it with a compact base surface having peripheral regions out of which the conductor tracks can be formed to extend back and forth so that they may be bent or extended outward after stamping out or separating at least regions thereof leading to the terminal contacts, before the terminal contacts of the mutually remote components are connected. In this way when the terminal contacts are connected, the flexible printed circuit board assumes a branching form from the outside, which covers a surface area that is enlarged as compared with the compact base surface.

7 Claims, 2 Drawing Sheets

STRUCTURE FOR CONNECTING A PLURALITY OF MUTUALLY REMOTE ELECTRICAL COMPONENTS TO A CENTRAL UNIT

BACKGROUND OF THE INVENTION

Field of the Invention

The invention relates to a structure for connecting a plurality of mutually remote electrical components to a central unit, including a flexible printed circuit board having an inner region with contact surfaces for contacting connection contacts of the central unit, and individual conductor tracks having one end at the contact surfaces and another end for connection of the electrical components.

Such a structure is equivalent to an electrical connection between a hybrid component group and a flexible printed circuit board, which is known from German Published, Non-Prosecuted Patent Application DE 38 13 566 A1. That electrical connection includes two lines of conductors, each with a plurality of conductor tracks, which are exposed in the region of a cutout of the printed circuit board for contacting with contacts of the hybrid component group. The printed circuit board has holes by which it can be affixed to a substrate acting as a cooling body. Connection tracks constructed on free ends of the conductor tracks rest on contact surfaces of the hybrid component group and are electrically connected through the use of clip soldering processes.

In many applications, the problem arises of connecting a plurality of mutually remote electrical components to a central unit. The central unit may, for instance, be provided with a multiple plug by way of which the components can be connected to a central control unit or the like. One example of such an application is an automatic transmission, in which various sensors for detecting rotary speeds, pressures and temperatures are disposed, and which includes electric actuators for actuating couplings or switch elements.

It is known from German Published, Non-Prosecuted Patent Application DE 44 30 798 A1, corresponding to U.S. Pat. No. 5,831,835, filed Feb. 28, 1997, to construct the conductor tracks required for connecting the components to the central unit, in the form of a stamped grating, which, for instance, is formed of a copper alloy. The stamped grating is stamped out from a metal sheet or plate and incorporated into a support body inside the transmission housing. The stamped grating is additionally provided with a plastic covering to protect against short circuits caused by metal chips. Overall, the use of a stamped grating is relatively expensive, because of the requisite tool expense among other reasons.

The use of flexible printed circuit boards or flexible conductor films is also conventional for connecting a plurality of electrical components that are distant from one another. Such flexible printed circuit boards, for instance, are formed of a polyimide film or slab onto which a conductive copper layer is applied through the use of an adhesive, such as an acrylic adhesive, and the copper layer can in turn be coated with silver. Flexible printed circuit boards of that kind are made to be very supple without damage to the electrical conductor tracks. Another advantage is that the flexible printed circuit boards can be made oil-resistant, so that they can also be used inside transmission housings where they come into contact with transmission oil. However, the oil-resistant flexible printed circuit boards are relatively expensive, so that when used for the aforementioned purpose the surface area that is consumed is great. Overall, that leads to costs that are high, similarly to those involved in the use of stamped gratings.

SUMMARY OF THE INVENTION

It is accordingly an object of the invention to provide a structure for connecting a plurality of mutually remote electrical components to a central unit, which overcomes the hereinafore-mentioned disadvantages of the heretofore-known devices of this general type, while ensuring low costs and high functional reliability.

With the foregoing and other objects in view there is provided, in accordance with the invention, a structure for connecting a plurality of mutually remote electrical components to a central unit, comprising a flexible printed circuit board having a compact base surface with peripheral regions; an inner region; contact surfaces in the inner region for contacting connection contacts of a central unit; and individual conductor tracks each having one end at the contact surfaces and another end, the conductor tracks stamped out and bent outward from the peripheral regions during production of the printed circuit board for outwardly branching the printed circuit board to cover an area larger than the compact base surface and for connecting the other ends to mutually remote electrical components.

As a result of the invention it is possible to connect a plurality of electrical components to a central unit, beginning with a rectangular flexible printed circuit board, for instance. The spacing of the components from one another and the spacing between the components and the central unit are considerably greater than the dimensions of the flexible printed circuit board in its initial state.

In accordance with another feature of the invention, there is provided a bottom part, the flexible printed circuit board having a region beneath the central unit, the region beneath the central unit having a cutout defining a peripheral region of the printed circuit board, and the peripheral region sandwiched between the central unit and the bottom part causing the connection contacts to contact the contact surfaces.

In accordance with a further feature of the invention, there is provided a heat-conducting adhesive securing the central unit to the bottom part.

In accordance with an added feature of the invention, there is provided an electrically conductive adhesive connecting the contact surfaces to the connection contacts.

In accordance with an additional feature of the invention, there is provided a cap, a bottom part and an encompassing seal, the flexible printed circuit board disposed around the central unit and sandwiched between the cap and the bottom part with the interposition of the seal.

In accordance with yet another feature of the invention, some of the conductor tracks leading to the mutually remote components extend over one another.

In accordance with a concomitant feature of the invention, at least some of the mutually remote electrical components are disposed inside a transmission housing having an interior, and the seal separates the central unit from the interior of the transmission housing.

Other features which are considered as characteristic for the invention are set forth in the appended claims.

Although the invention is illustrated and described herein as embodied in a structure for connecting a plurality of mutually remote electrical components to a central unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
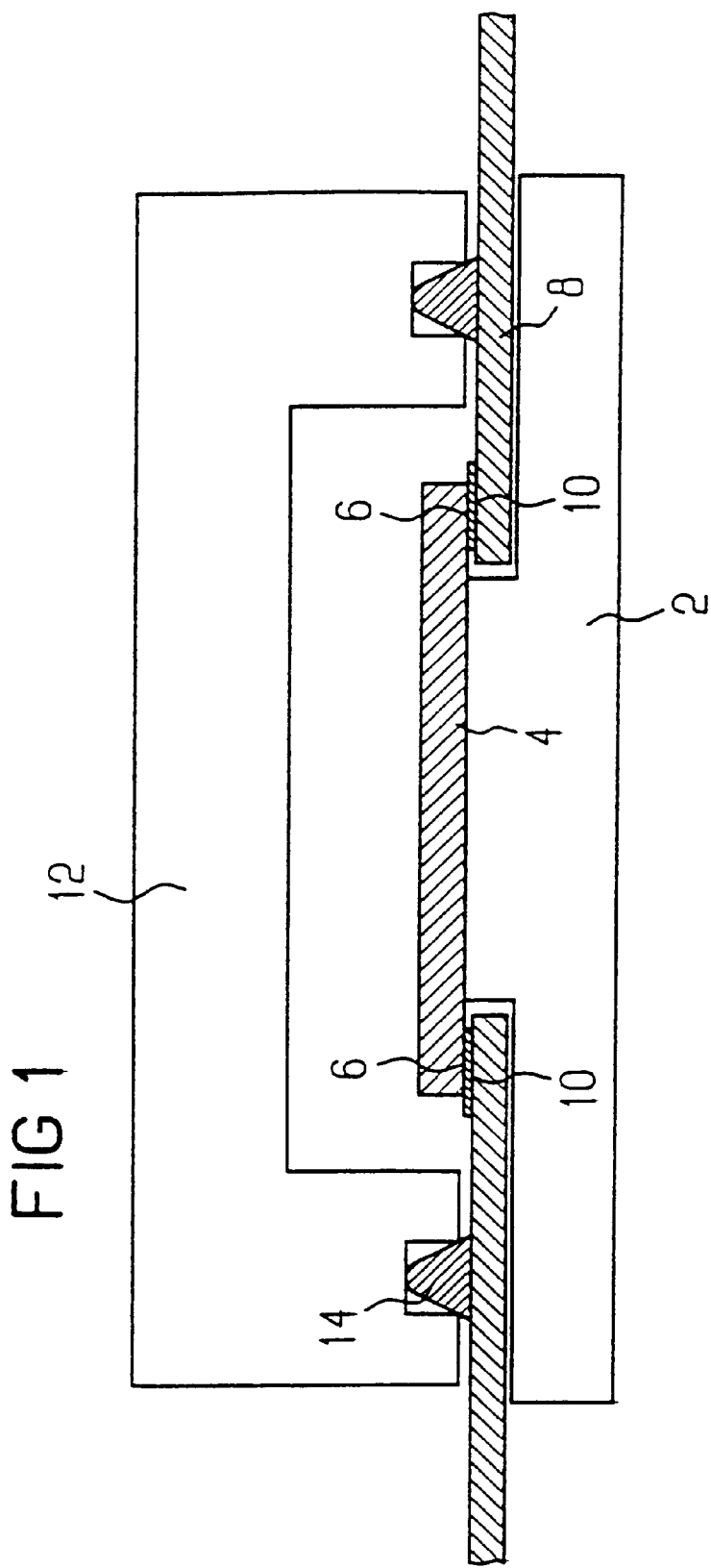
FIG. 1 is a fragmentary, diagrammatic, cross-sectional view of a region where a flexible printed circuit board is connected to a central unit.

Referring now to the figures of the drawings in detail and first, particularly, to FIG. 1 thereof, there is seen a bottom part 2 which is disposed, for instance, in an interior of a non-illustrated transmission housing and is provided with a graduated surface. The bottom part 2 is advantageously formed of aluminum, since that metal has good heat conductivity. A base plate of a central unit 4 is adhesively bonded with a raised region of the bottom part 2 through the use of a heat-conducting adhesive. The central unit 4 may be constructed as a hybrid device and is provided directly with connection contacts 6 which are exposed along a lower surface of their outer periphery. A flexible printed circuit board 8 is disposed around the raised region of the surface of the bottom part 2. The printed circuit board 8 has conductor tracks that end in contact surfaces 10 which are connected to the connection contacts 6 through the use of an electrically conductive adhesive. A cap 12 is secured to the bottom part 2, for instance through the use of non-illustrated screws or rivets. An encompassing seal 14 which is disposed between the cap 12 and the flexible printed circuit board 8 seals off a space between the bottom part 2 and the cap 12 from the outside in an oil-tight manner. That space receives the central unit 4. The entire configuration shown may be accommodated inside a transmission housing or may be mounted directly on an outer wall of the transmission housing. In either case the central unit 4 is reliable protected against the oil of the transmission and against other environmental factors. The central unit 4 may be merely a unit that connects many outgoing conductor tracks with conductor tracks that lead to a multiple plug. However, it may also be a unit that itself contains current supply and control circuits, the individual components of which are not shown. The bottom part 2 formed of aluminum and the adhesive bonding of the central unit 4 to the bottom part 2 through the use of a heat-conducting adhesive assure reliable heat dissipation.

The entire structural group shown in FIG. 1 is disposed on the hydraulic circuit board of an automatic transmission inside the transmission housing, for instance along with an additional support part or a support part integrally constructed with the cap. The support part carries the conductor tracks of the flexible printed circuit board and ends in a multiple plug.

Figure 2:
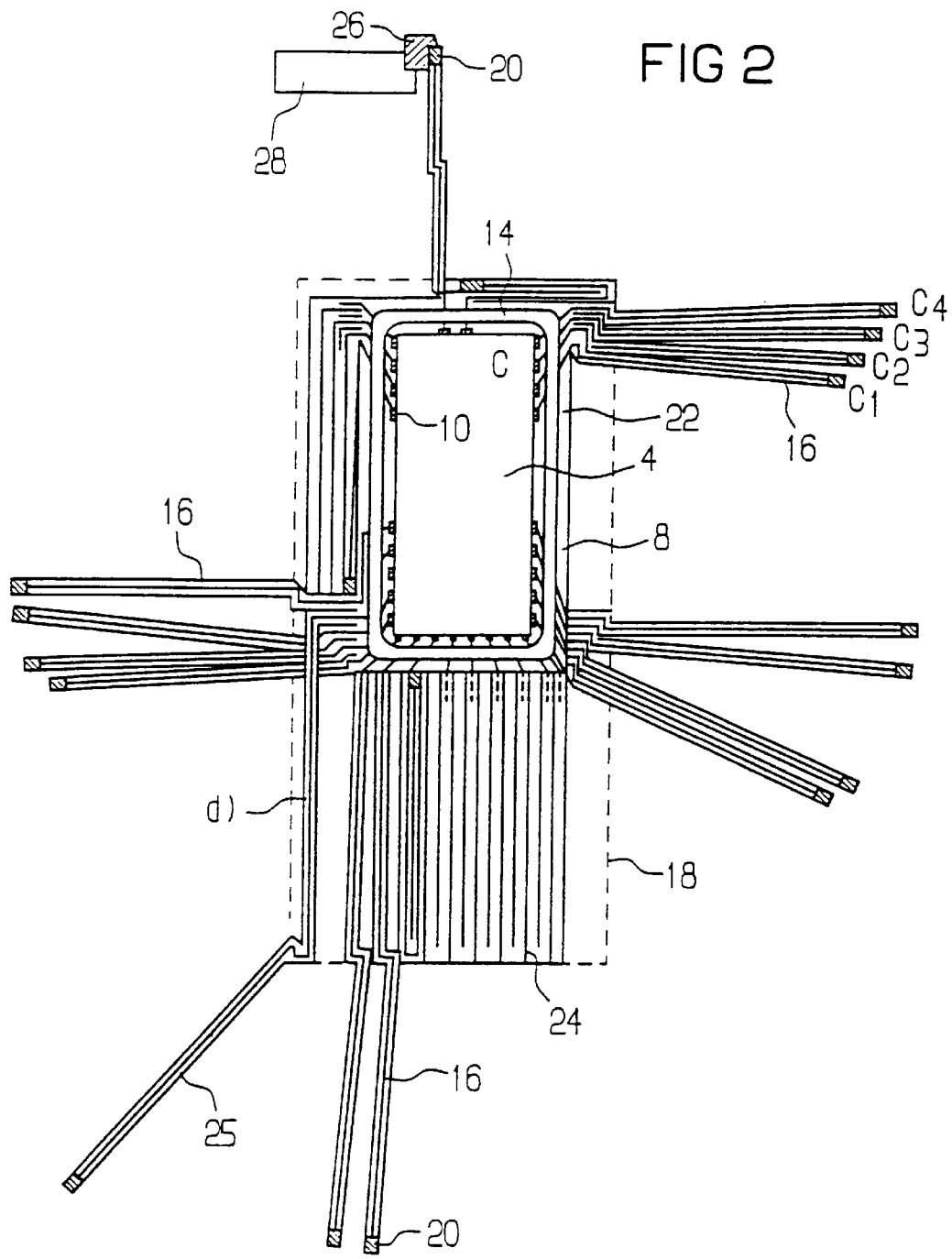
FIG. 2 is a plan view of the configuration of FIG. 1 with the cap removed.

FIG. 2 shows a plan view of the configuration of FIG. 1 with the cap 12 removed. The figure clearly shows the central unit 4 and the flexible printed circuit board 8 with the contact surfaces 10, in which individual conductor tracks 16 of the flexible printed circuit board 8 terminate below the central unit 4. The seal 14, which rests on the flexible printed circuit board 8, extends around the contact surfaces 10, surrounding the central unit 4. The seal 14 is disposed in a region 22 surrounding the central unit 4.

The flexible printed circuit board 8, as shipped, has a rectangular outline or compact base surface 18 represented by a dashed peripheral line. The flexible printed circuit board 8 is cut out below the central unit 4. The conductor tracks 16 are formed on the flexible printed circuit board 8 in accordance with later needs. The conductor tracks 16 terminate in the contact surfaces 10 toward the central unit 4 and they terminate in contact surfaces 20 at their free ends.

The individual conductor tracks 16 may be printed-on or etched to expose them, etc. and they are constructed in such a way that they can be formed to extend back and forth so that they may be bent or extended out through the use of stamp lines 24 outside the region 22 after the individual conductor tracks 16 or flexible film strips 25 carrying them have been stamped out. The individual conductor tracks therefore extend outside the peripheral line indicating the base surface 18. This leads to an overall branched construction of the flexible printed circuit board. The contact surfaces 20 which are constructed on the ends of the conductor tracks 16 may, for example, be connected through the use of an electrically conductive adhesive to terminal contacts 26 of components 28 to be connected. The components 28, only one of which is shown, are sensors, actuators or plugs, in the exemplary application of an automatic transmission which is discussed herein.

The structure of the individual conductor tracks 16 will now be explained by taking a contact group c at the top right of FIG. 2 as an example:

One respective conductor track $c_1$–$c_4$ leads away from each of four contact surfaces 10 that are shown. The conductor tracks are initially constructed on the flexible printed circuit board in such a way that the conductor tracks $c_1$–$c_4$ are located parallel side by side from the inside out within the peripheral line indicating the base surface 18. Next, the stamping lines 24 are impressed into the flexible printed circuit board between the conductor tracks $c_1$–$c_4$ as well as between the innermost conductor track $c_1$ and the region 22, in such a way that the individual conductor tracks $c_1$–$c_4$ can be folded out or bent over, and are individually available for the connection of individual non-illustrated electrical components.

As is shown for the contact group at the bottom left in FIG. 2, it is entirely possible for individual conductor tracks to cross one another, as is shown in this example for a conductor track d, which crosses three conductor tracks that lead away to the left.

As can be seen, it is possible to form very long conductor tracks by having them extend back and forth multiple times on the flexible printed circuit board 8 in its original state and then unfolding them multiple times accordingly. In the example shown, twenty-eight contact surfaces 10 are available. The surface area of the surface, which can be equipped with the "unfolded" flexible printed circuit board having the contact surfaces 20, is increased by a factor of approximately 5, as compared with the original surface area of the flexible printed circuit board 8. No trimming waste is created. The flexible plastic foundation material of the flexible printed circuit board, of which one flexible film strip 25 belongs to each conductor track 16, is entirely used for the branches of the flexible printed circuit board that lead to the individual components.

It is understood that the conductor tracks 16 may be formed on one or both sides of the foundation film, and that the layout of the conductor tracks and the stamping lines constructed between them will depend on aspects of expediency, such as the spatial configuration of the components to be connected, the current intensities that occur, thermal conditions, electromagnetic factors, and so forth. The course of the individual conductor tracks or branches of the flexible printed circuit board is extraordinarily flexible. An additional plastic body may be provided for supporting the individual conductor tracks that extend over large distances.

The conductor tracks may be provided with a plastic layer, so that additional insulators are unnecessary. No additional contact lugs and so forth are needed, because the contacting can be effected directly through the contact surfaces 20 provided on the ends of the conductor tracks. Thus bonding, welding or riveting operations can be dispensed with. The conductor tracks can be additionally fastened mechanically to the components to be connected.

The flexible printed circuit board is extraordinarily stable mechanically and chemically, so that high functional reliability is assured.

I claim:

1. A structure for connecting a plurality of mutually remote electrical components to a central unit, comprising:
   a flexible printed circuit board having:
      a compact base surface with peripheral regions;
      an inner region;
      contact surfaces in said inner region for contacting connection contacts of a central unit; and
      individual conductor tracks each having one end at said contact surfaces and another end, said conductor tracks stamped out and bent outward from said peripheral regions for outwardly branching said printed circuit board to cover an area larger than said compact base surface and for connecting said other ends to mutually remote electrical components such that substantially no peripheral region remains and substantially all the material of the peripheral region is formed into said bent outward tracks.

2. The structure according to claim 1, which comprises a bottom part, said flexible printed circuit board having a region beneath the central unit, said region beneath the central unit having a cutout defining a peripheral region of said printed circuit board, and said peripheral region sandwiched between the central unit and said bottom part causing the connection contacts to contact said contact surfaces.

3. The structure according to claim 2, including a heat-conducting adhesive securing the central unit to said bottom part.

4. The structure according to claim 2, including an electrically conductive adhesive connecting said contact surfaces to the connection contacts.

5. The structure according to claim 1, including a cap, a bottom part and an encompassing seal, said flexible printed circuit board disposed around the central unit and sandwiched between said cap and said bottom part with the interposition of said seal.

6. The structure according to claim 1, wherein some of said conductor tracks leading to the mutually remote components extend over one another.

7. The structure according to claim 5, wherein at least some of the mutually remote electrical components are disposed inside a transmission housing having an interior, and said seal separates the central unit from the interior of the transmission housing.

* * * * *